(12) United States Patent
Lim et al.

(10) Patent No.: US 6,544,816 B1
(45) Date of Patent: Apr. 8, 2003

(54) METHOD OF ENCAPSULATING THIN SEMICONDUCTOR CHIP-SCALE PACKAGES

(75) Inventors: Tiang Hock Lim, Singapore (SG); Liang Chee Tay, Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/378,450

(22) Filed: Aug. 20, 1999

(51) Int. Cl.[7] .............................................. H01L 21/44
(52) U.S. Cl. ...................... 438/112; 438/124; 438/126; 438/127; 257/685; 257/723; 257/724
(58) Field of Search ................................ 438/110, 111, 438/112, 113, 124, 125, 126, 127; 257/685, 679, 723, 724, 725, 787, 788

(56) References Cited

U.S. PATENT DOCUMENTS

| | | | |
|---|---|---|---|
| 4,043,027 A | | 8/1977 | Birchler et al. |
| 5,098,626 A | | 3/1992 | Pas |
| 5,148,266 A | | 9/1992 | Khandros et al. |
| 5,431,854 A | | 7/1995 | Pas |
| 5,726,489 A | * | 3/1998 | Matsuda et al. ............ 257/659 |
| 5,739,585 A | * | 4/1998 | Akram et al. ............... 257/680 |
| 5,776,796 A | | 7/1998 | Distefano et al. |
| 5,925,934 A | * | 7/1999 | Lim ............................. 257/693 |
| 6,049,129 A | * | 4/2000 | Yew et al. .................... 257/737 |
| 6,087,202 A | * | 7/2000 | Exposito et al. ............ 438/127 |
| 6,187,243 B1 | * | 2/2001 | Miyajima ............... 264/272.15 |
| 6,200,121 B1 | * | 3/2001 | Tsuruta ........................ 257/724 |
| 6,331,737 B1 | * | 12/2001 | Lim et al. .................... 257/693 |

FOREIGN PATENT DOCUMENTS

| | | |
|---|---|---|
| JP | 9702348-5 | 2/1997 |
| JP | 9800005-2 | 2/1998 |
| JP | 9800006-0 | 2/1998 |

* cited by examiner

*Primary Examiner*—Kevin M. Picardat
(74) *Attorney, Agent, or Firm*—Michael K. Skrehot; Wade James Brady, III; Frederick J. Telecky, Jr.

(57) ABSTRACT

An apparatus for the fabrication of a semiconductor device comprising: a mold having top and bottom halves, each with cavities for holding semiconductor chips pre-assembled on an electrically insulating interposer; one of said halves having a plurality of runners and a plurality of gates for feeding encapsulation material into said cavities; said plurality of runners comprising pairs of runners parallel to each other, having gates opposite to each other, thereby forming dual gates; each pair of runners being configured such that encapsulation material will exit from adjacent gates concurrently; and each pair of dual gates being structured such that they fill the cavity between them uniformly with encapsulation material, thereby encapsulating thin semiconductor devices.

16 Claims, 3 Drawing Sheets

METHOD OF ENCAPSULATING THIN SEMICONDUCTOR CHIP-SCALE PACKAGES

The present invention is related in general to the field of semiconductor devices and processes, and more specifically to encapsulation methods for integrated circuit chips resulting in thin and substantially flat packages having substantially the same outline as the circuit chip.

BACKGROUND OF THE INVENTION

During the last few years, a major trend in the semiconductor industry has been the effort to shrink semiconductor packages so that the package outline consumes less area and less height when it is mounted onto customer circuit boards, and to reach these goals with minimum cost (both material and manufacturing cost). One of the most successful approaches has been the development of so-called "chip-scale packages". These packages have an outline adding less than 20% to the chip area. A chip-scale package which has only the outline of the chip itself, is often referred to as "chip-size package". While a number of designs have been successfully demonstrated to achieve substantially flat packages having substantially the same outline as the circuit chip, the reduction in device thickness has been quite limited and essentially elusive.

One of the earliest successful approaches to chip-scale packaging includes the use of sheet-like polymer interposers between and/or around elements of the semiconductor packages in order to reduce and/or redistribute the strain and stress on the connections between the semiconductor chip and the supporting circuitized substrate during operation of the chip. A description can be found for instance in U.S. Pat. No. 5,148,266, Sep. 15, 1992 (Khandros et al.) entitled "Semiconductor Chip Assemblies having Interposer and Flexible Lead". It introduces a spacer layer (made of compliant or elastomeric material) between a top surface of a sheet-like substance and a contact bearing surface of a semiconductor chip, wherein the substrate has conductive leads thereon, the leads being electrically connected to terminals on a first end and bonded to respective chip contacts to a second end.

In U.S. Pat. No. 5,776,796, Jul. 7, 1998 (Distefano et al.) entitled "Method of Encapsulating a Semiconductor Package", the encapsulation method introduces curable liquids such as electronic grade silicone-based.or epoxy-based resins by using needle-like dispensers, moving around the periphery of the chip, until the desired level of encapsulant has been substantially uniformly dispensed. Dependent on the material, the encapsulant is then cured by radiant energy, thermal energy, moisture, or ultraviolet light. Typically, this encapsulation method is performed simultaneously on a plurality of chips which are sharing a common frame. Finally, a dicing saw, water jet, ultrasonic knife, rotary razor, or laser separates the encapsulated chip assembly structure from the frame so that the resultant chip package is no, or only slightly, wider than the periphery of the chip itself. With some effort, the encapsulate will not flow onto the back surface of the chip; it can thus subsequently be connected to a heat sink without an insulative material impeding the dissipation of heat from the chip.

Within the semiconductor memory product families, one of the most promising concepts for chip-scale packages is the so-called "board-on-chip" design. Recently, patent application entitled "Chip-size Integrated Circuit Package" has been filed by Texas Instruments in Singapore on Jul. 02, 1997 under Ser. No. 9702348-5, and in the USA on Dec, 19, 1997 under Ser. No. 08/994,627. An approach to reduce the package height and to reach a low device profile with the board-on-chip design has been described in the patent applications entitled "Thin Chip-size Integrated Circuit Package and Method of Fabrication" filed in Singapore on Jan. 2, 1998 under Ser. Nos. 9,800,005-2 and 9,800,006-0. These devices use wire ball bonding for assembly; because of the extreme sensitivity of the thin wires against mechanical disturbances, careful protection by reliable encapsulation is needed; liquid potting material is dispensed by needle-like syringes and later cured. If solder balls are used to assemble the devices on circuit boards, this encapsulation has to withstand the mechanical stress caused by the difference in thermal expansion coefficients of the material involved.

Since in all these approaches to chip-scale packages, the process of encapsulating the device comprises distributing semi-viscous material from the openings of syringes onto preselected regions of the device surfaces to be covered, and then distributing the material over the whole area and into openings to be filled with the help of capillary forces, this technology obviously suffers from-several shortcomings. Foremost, the existing technology is not economical. In order to keep the number of dispensers in practical limits, only a modest number of packages can be encapsulated in one fabrication step; the process does not lend itself to mass production. Secondly, the process is hard to control uniformly, and prone to statistical variations such as uneven fillings, pronounced meniscus formation, or flaws such as voids. It has been the experience over several years of production that a high percentage of the devices exhibit cosmetic flows. Further, the choice of materials is limited to liquid materials which typically require prolonged "curing" times for polymerization and hardening, causing high mechanical stress in the product. In addition, the liquids tend to splatter onto exposed semiconductor surfaces, thus causing particulate contamination inhibiting the application of flat heat sinks.

Understandably, efforts have been expanded to apply the conventional transfer molding technology to produce thin semiconductor products. The transfer molding technology was introduced to semiconductor devices (U.S. Pat. Nos. 3,716,764 and 4,043,027) as an encapsulation process which is both gentle and reliable, and exceedingly well applicable to mass production. Over the years, transfer molding has been applied to almost all semiconductor device types, but it has proved extraordinarily difficult to produce devices thinner than about 0.8 mm total thickness. The main difficulty has been the adhesion of the molding material to the cavity walls of the steel molds, which proved to become dominant over the adhesion of the molding material to the device parts when the molded layers shrink below about 0.2 mm thickness (dependent on the chemistry of the material). The thin molded layers also tended to break after polymerization.

A partial solution arrived with U.S. Pat. No. 5,098,626 of Mar. 24, 1992 (Pas, "Method for Packing a Measured Quantity of Thermosetting Resin and Operating a Mold for Encapsulating a Component") and U.S. Pat. No. 5,431,854 of Jul. 11, 1995 (Pas, "Method for Pressing a Plastic, which Cures by means of a Reaction, into a Mold Cavity, a Pressing Auxiliary in Pill Form to be Used in this Method, and a Holder Composed of such Material"). The emphasis is placed on cleanliness of the molding material by prepacking and sealing it in plastic forms which are only ruptured at time of usage, and on preventing the deleterious adhesion to the mold cavity walls of the molding material by covering thin continuous plastic films over-the mold walls. For this purpose, the pulling forces from vacuum "dispensed" from numerous openings pressure the flexible films against the walls, thus keeping the molding material away from the walls. However, until now the so-called "3-P" technology is intended for encapsulating only standard-size semiconductor devices and does not offer the unique processes, mold designs or molding materials needed for encapsulating devices with at least one minimized geometry.

An urgent need has therefore arisen for a coherent, low-cost method of encapsulating thin semiconductor chip-scale packages. The method should be flexible enough to be applied for different semiconductor product families and a wide spectrum of design and process variations, should eliminate all cosmetic and substantial flaws in those products, and should allow the usage of various formulations of encapsulating materials. Preferably, these innovations should be accomplished while shortening production cycle time and increasing throughput.

SUMMARY OF THE INVENTION

The present invention provides a method of encapsulating a semiconductor device; it especially relates to high density integrated circuits in packages which have an outline similar to the integrated circuit chip itself, and a low profile. These circuits can be found in many device families such as processors, digital and analog devices, memory and logic devices, high frequency and high power devices, especially in large chip area categories. The invention helps to alleviate the space constraint of continually shrinking applications such as cellular communications, pagers, hard disk drives, laptop computers and medical instrmentation.

In accordance with the present invention, a molding method and apparatus are provided in conjunction with specially developed encapsulation materials of low viscosity and high adhesion The.transfer molding process based on the invention results in ultra-thin devices free of any voids and having unusually flat surfaces and high luster. The combination of system and special materials for the transfer molding process further allows an order of magnitude higher production throughput compared to conventional potting encapsulation. The method comprises the option of retaining one chip surface free from any contamination, or to over-mold it with a protective layer of predetermined thickness.

It is an object of the present invention to be applicable to a variety of different semiconductor chip-scale package (CSP) designs, for example: Active chip surface assembled on connection-carrying interposer, passive chip surface assembled on connection-carrying interposer, board-on-chip assembly, peripheral bonding, center-line bonding, area bonding, wire bonding and flip-chip.

For the miniaturized assembly feature sizes to be encapsulated free of voids, the invention replaces the conventional potting method by a transfer molding technique. Low viscosity of the encapsulation material is required. In order to achieve the desired low profile on the order of 0.5 mm, strong adhesion of the encapsulation material to all differentiated materials of the assembly is required. The invention solves these conflicting needs by developing new encapsulation material formulations and processing these materials in a modified "3-P" molding technique with its film-protected mold surfaces.

As side benefits of using the "3-P" technology, the pre-assembled devices are protected against contamination and chip cracking, and the mold system avoids down time and cost due to customary routine cleaning requirements.

It is an object of the present invention to provide a low-cost method and system for packaging chip-scale devices in thin overall profile.

Another object of the present invention is to provide a significantly higher production throughput.

Another object of the invention is to improve product quality by eliminating cosmetic flaws and obtaining precise and reproducible geometries for the finished product, and to provide reliability assurance through in-process control at no extra cost.

Another object of the invention is to introduce assembly concepts for thin profiles and reliability which are flexible so that they can be applied to many families of semiconductor products, and are general so that they can be applied to several future generations of products.

Another object of the invention is to minimize the cost of capital investment and the movement of parts and product in the equipment.

These objects have been achieved by the teachings of the invention concerning systems and methods suitable for mass production. Various modifications have been employed for the encapsulation of assembled semiconductor chips as well as connective interposers and substrates.

In one embodiment of the invention, the encapsulation material is pressured into the mold cavity when the gate is located above the plane defined by the interposer (socalled "top gate" arrangement).

In another embodiment of the invention, the encapsulation material is pressured into the mold cavity when the gate is located below the plane defined by the interposer (so-called "bottom gate" arrangement).

In another embodiment of the invention, the ranges and combinations of viscosity, glass transition temperature, and filler size of the encapsulation material are modified and varied in order to optimize the flow characteristics and adhesion of the material as a function of the molding system parameters.

In another embodiment of the invention, the apparatus for the transfer molding in the fabrication of a semiconductor device comprises pairs of runners with a plurality of dual gates supplying encapsulation material simultaneously and uniformly for forming ultra-thin chip-scale packages.

In another embodiment of the invention, the molding process parameters (temperature, time, pressure, transfer, curing, etc.) are modified in order to optimize them relative to the system and process parameters.

In yet another aspect of the invention, benefits are derived from the fast-speed singulation methods (such as sawing) of the encapsulated devices, and the lower costs of the molding compounds and methods (as compared to potting materials and methods).

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
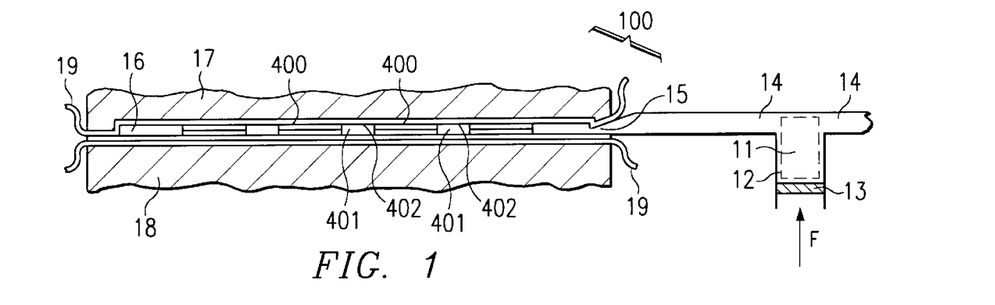
FIG. 1 is a simplified cross section through the cavity of a mold, lined with plastic films on top and bottom mold halves, with integrated circuit chips pre-assembled on an interposer, for fabricating thin packages having an exposed chip surface according to the invention.
Figure 2:
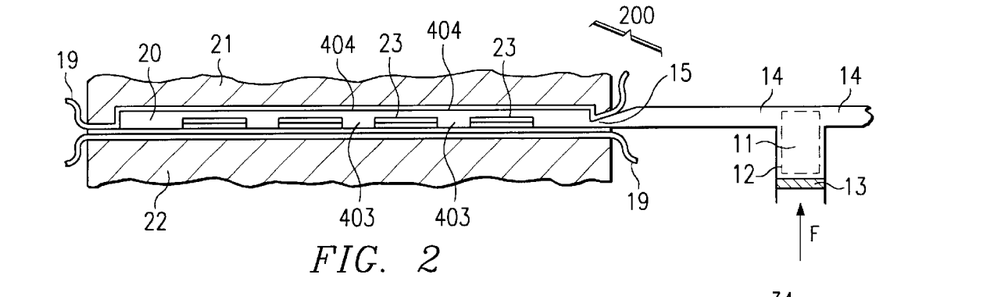
FIG. 2 is a simplified cross section through the cavity of a mold, lined with plastic films on top and bottom mold halves, for fabricating thin packages. having the chip completely encapsulated.

The present invention adopts essential features of the so-called "3-P" molding technology and modifies them for preferred embodiments as illustrated in FIGS. 1 and 2. The term "3-P" refers to the concept of using material as "pre-packaged product". The encapsulation material is carefully cleaned from impurities and gaseous contents, and thereafter wrapped in thin plastic films. With this protection from the environment, the material is shipped to the customer, who can use it in clean condition. The wrapped product may be fabricated in various geometrical forms, for instance in elongated, narrow shapes reminiscent of pencils. Such "pencils" are preferred shapes of encapsulation due to their ease of operation in transfer molding.

Figure 11:
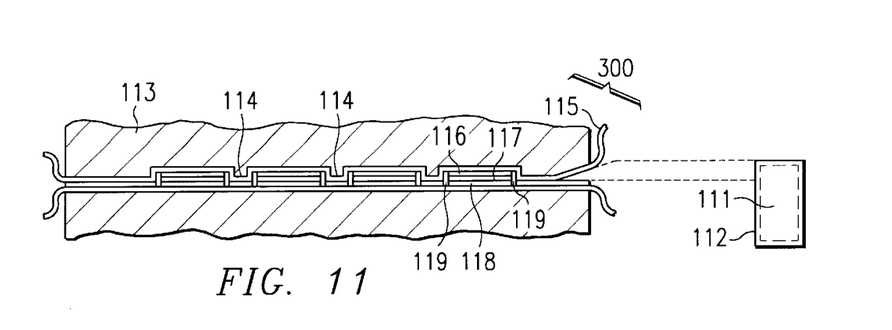
FIG. 11 depicts another embodiment of the invention; a simplified cross section through the cavity of a mold, lined with plastic films on top and bottom mold halves, and the top half having castellations separating individual devices, as needed for fabricating specific thin semiconductor chip-scale packages with a molded frame around each chip.

The cross section of a mold is generally designated 100 in FIG. 1, and a similar cross section is designated 200 in FIG. 2 (and 300 in FIG. 11). The encapsulation material 11, wrapped in plastic film 12, is placed in a groove; as mentioned, a preferred shape of such groove is reminiscent of "pencils". From the bottom of the groove, force F presses moveable piston 13 into the groove until the wrapping ruptures and the material is squeezed into runners 14. Finally, the material is pressed through gates 15 into the cavities of the mold. The flow rate is controlled by the force F, the lengths and cross sections of the runners, the cross section of the gates, the temperature of the transfer operation, and the viscous and flow characteristics of the material. In "3-P" technology, groove 12, runners 14 and gates 15 have thin plastic films on their inner walls, protecting the material against influences from the environment, and preventing any contact between the encapsulation material and the walls the apparatus. This feature of no-contact between material and walls allows the use of lower cost materials (such as ceramics) than the traditional special steel for fabricating the mold equipment.

In FIG. 1, the mold 100 comprises the top half 17 and the bottom half 18; together they form cavity 16. The inner surfaces of cavity 16 are completely lined with thin plastic films 19, preventing any contact between the walls of cavity 16 and the encapsulation material. Capitalizing on this pivotal feature, the present invention allows the application of extra high adhesion materials without running a risk that the material may stick to the mold walls. Consequently, the high adhesion capability can be fully utilized for insuring strong adhesion to the widely different materials found in semiconductor. devices (parts made of semiconductor, metals, insulators, inorganic or organic materials, etc.), and thus guaranteeing high mechanical stress tolerance of the finished device—an essential prerequisite for very low profile components.

The encapsulation compounds especially suitable and developed for high adhesion comprise epoxy-based thermoset resins and silicone-based elastomerics. They are commercially available from Shin Etsu Chemical Corporation, Japan, or Kuala Lumpur, Malaysia, or Sumitomo Bakelite Corporation, Japan, or Singapore, Singapore. In addition, thermoplastics as well as liquid-crystal polymers are suitable.

In addition to high adhesion, these encapsulation materials exhibit very low viscosity at molding temperatures (while solid at room temperature). With this feature, the minute spaces found in thin semiconductor chip-scale packages (for instance around the electrical connections, see the device examples in FIGS. 4 through 8), can be reliably filled with encapsulation material. Voids or other cosmetic defects, which plague thin devices made by conventional technology, are completely eliminated.

Typical compound formulations comprise viscosities in the range from 30 to 200 poise, glass transition temperatures from 100 to 230° C., and filler sizes from 1 to 75 $\mu$m with a median from 15 to 25 $\mu$m (fillers are needed to lower the coefficient of thermal expansion and increase the strength and flexibility of the molding material). The molding process parameters are recommended in the following ranges: Molding temperature from 140 to 220° C. (preferred temperature 175° C.), cure times from 70 to 120 s, clamping pressure from 18 to 33 tons, transfer time from 5 to 18 s, transfer pressure: initial pressure from 50 to 80 kg/cm$^2$, final pressure from 15 to 30 kg/cm$^2$.

With these materials and process parameters, molded profiles between 0.15 and 0.3 mm are achievable.

As defined herein, the term "profile" refers to the thickness or height of the part under discussion (here: the molded layer), and may be measured in, for example, millimeters (mm).

Another distinguishing feature of the present invention, which is based on the usage of the thin plastic films covering the mold cavity walls, is the high luster of all molded surfaces. This high luster appears on smooth as well as matte surfaces, and originates from the rounded contours of all surface features, which is caused by the rounding effect of the plastic film. Similar high luster could in the past only be achieved by careful polishing of all mold surfaces—a very expensive method. In addition, the high luster causes colors to appear more intensive; for instance, the conventional black molding compound color now appears significantly blacker.

In the cross section through the mold cavity depicted in FIG. 1, the plastic film 19 lining top mold half 17 is shown to rest tightly on the surfaces of the devices-to-be-encapsulated, forming interfaces 400. With this arrangement, those surfaces are not receiving any encapsulation material; furthermore, they are protected against any contamination or any spill-over, flash, or spurious material which could accidentally be deposited on those surfaces. Consequently, the device surfaces emerge clean from the encapsulation process.

On all sides extending from the interfaces 400, the encapsulation material fills spaces 401, forming completely flat interfaces 402 between the encapsulation material and the plastic film, which, after curing of the encapsulation material, extend the device surfaces as solid new surfaces of the encapsulant. These new surfaces have no meniscus or bulging, or any other surface irregularity since they have been formed along the flat, smooth boundary of the plastic film. They exhibit the high luster and intensive color described above.

In the cross section through the mold cavity depicted in FIG. 2, the thin plastic film 19 is also shown to surround mold cavity 20, which is formed by top mold half 21 and bottom mold half 22. In contrast to FIG. 1, however, the film lining top mold half 21 does not rest tightly on the devices-to-be-encapsulated, but rather provides space 23 on top of the devices-to-be-encapsulated. After the molding process, these spaces 23 are filled with encapsulation material, together with spaces 403 between the devices. With this arrangement, the devices are covered by an extensive layer of encapsulant, forming interface 404 to the plastic film, which, after curing, shows a flat, high-luster surface. Together with the surface of the adjacent filled spaces 23, a continuous flat, high-luster surface has been acquired.

Figure 3:
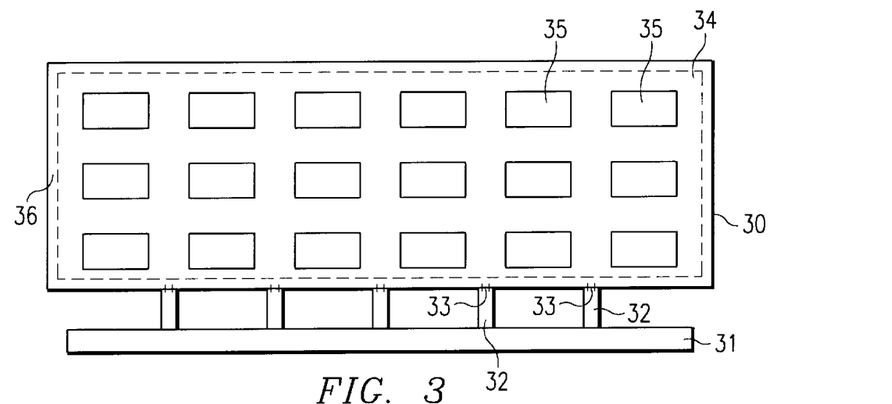
FIG. 3 is a simplified top view of runners and the cavity of a mold loaded with an interposer and a plurality of pre-assembled integrated circuit chips.

In the top view of the mold cavity shown in FIG. 3, a cavity 30 is depicted together with groove 31, runners 32 and gates 33. The encapsulation material in its pencil-shaped wrapping is positioned in groove 31. The number, position and cross sectional shape of the runners and the gates depend on the design of the mold and the results of mold flow modeling which aim at creating a common and uniform front of the encapsulation material progressing into the cavity 30 during the molding process (and which try to avoid formation of jets of encapsulation material emerging from the gates). The embodiment shown in FIG. 3 is only one of numerous solutions; another one are socalled "fan gates", each of which cover about 80 to 100% of the widths of the packages to be produced, and which are enabled by the "3-P" molding technology.

In FIG. 3, an electrically insulating interposer 34 is loaded into cavity 30, together with a plurality of integrated circuit chips 35 (examples of such semiconductor devices are detailed in FIGS. 4 through 8). The arrangement depicted allows the processing of numerous ICs in one process sLep, thus achieving a high production throughput. The throughput according to the present invention is between 8 to 15 times higher than the throughput by the conventional potting method (using needles and syringes). Further, the spaces between the devices are completely filled with encapsulation material. After this so-called array molding is completed and the encapsulation material cured, the separation of the devices is preferably performed by sawing because of the high-speed singulation. In this fashion, the devices obtain precise outlines and dimensions.

The mold shown in FIG. 3 indicates a margin 36 of the interposer which is clamped between the films of bottom and top halves of the mold such that no encapsulation material can be pressed out. The avoidance of any "flash" is another advantage of the "3-P" technology compared to standard mold design. Another embodiment of the present invention is described in FIG. 9.

As defined herein, the term "outline" relates to the overall width and length of the integrated circuit package of the present invention. The outline of the package is also referred to as the footprint of the package, because it defines the surface area on a wiring or assembly board that the package will occupy. Chip-scale packages have an outline adding less than 20% to the chip area. A chip-scale package which has only the outline of the chip itself, is often referred to as "chip-size package". The terms "substantially similar" and "substantially the same" refer to the relative outlines of certain parts of the package (such as the spacer layer, or the interposer) and the IC chip when they are within 10% of one another. In several devices, the difference in the outlines is about 2%, or may vanish altogether.

Figure 4:
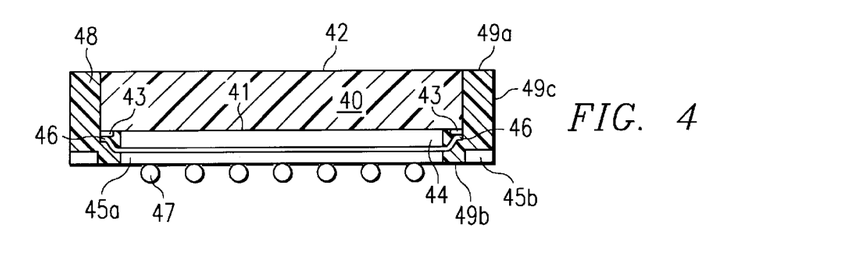
FIGS. 4 and 5 are simplified schematic cross sections of semiconductor integrated circuit chips assembled on interposers and encapsulated according to one embodiment of the present invention.

FIGS. 4 through 8 show schematic cross sections of different device types which can be fabricated as thin chip-scale packages using the present invention. In the device of FIG. 4, IC chip 40 has an outline given by the sawing of the semiconductor material, an active surface 41 and a passive surface 42. The active surface 41 comprises the integrated circuit and contact pads 43 around the periphery of the IC. For silicon ICs, the thickness (distance between active and passive surface) is between 200 and 375 $\mu$m, typically 275 $\mu$m. Other semiconductor materials comprise silicon germanium and gallium arsenide. The contact pads are aluminum, often doped with 2% copper and 1% silicon. or copper, or gold. A compliant spacer layer 44, typically a sheet-like elastomer, separates tie major portion of the active circuit surface 41 from the interposer 45a. Spacer layer 44 has a substantially similar outline as IC chip 40, thus characterizing the device as a chip-scale device. This interposer is an electrically insulating tape, for instance a flexible polyimide layer. On its surface facing the IC, it comprises a plurality of metallic leads (made, for example, of gold) which are glued to the spacer layer 44 and on their free ends contact the circuit pads 43. On the opposite surface, the interposer 45a has an array of solder balls 47 which are attached after the device has been singulated. Electrically conductive paths extending through interposer 45a connect leads 46 to the solder balls 47 on an individual basis.

It should be mentioned that the term solder "balls" used herein does not imply that the solder contacts are necessarily spherical; they may have various forms, such as semispherical, half-dome, truncated cone, or generally bump. The exact shape is a function of the deposition technique (such as evaporation, plating, or prefabricated units) and reflow technique (such as infrared or radiant heat), and the material composition. Several methods are available to achieve consistency of geometrical shape by controlling amount of material and uniformity of reflow temperature.

When devices of the type shown in FIG. 4 are molded using the mold of FIG. 1 and the method of the present invention, the encapsulation material 48 is filling spaces around the periphery of chip 40 and surrounding bond pads 43 and leads 46. Very noticeably, the encapsulation material 48 is forming surfaces 49a coplanar with passive chip surface 42 as a flat extension of it, and also surfaces 49b coplanar with interposer 45a as a flat extension of its surface opposite the IC. These surfaces, newly formed by the molding process of the invention, exhibit high luster and intensive color, and are free of cosmetic defects.

Electrically insulating interposer 45a comprises a first and a second surface and a plurality of electrically conductive paths extending through the interposer from the first to the second surface, forming electrical entry and exit ports on the interposer. The entry ports are attached to the leads 46. After completing the molding process, an array of solder balls 47 is attached to the exit ports.

Due to the uniformity of the molded portions created by the molding process of the invention, sawing is the preferred method of device singulation. Using this technique, peripheral surfaces 49c are generated. In FIG. 4, the peripheral surface 49c incorporates a frame 45b of interposer material in order to define the edge of the package; this design option as well as others are within the scope of the present invention. The singulated device of FIG. 4 will thus comprise precise package outlines and dimensions.

The device shown in FIG. 4 is a thin chip-scale package. After attachment of the solder balls, the overall profile is between 0.4 to 1.7 mm. Using the advantages of the encapsulation method of the present invention, a typical device profile is 0.7 mm.

Figure 5:
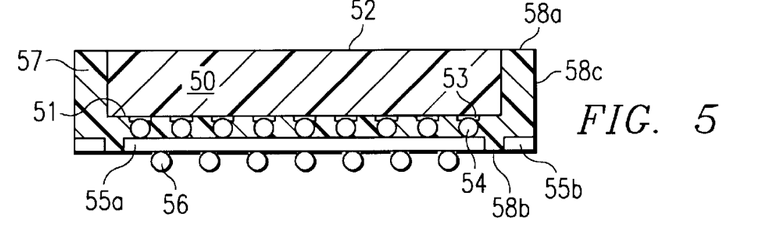

In another embodiment, the present invention delivers similar advantages for chip-scale packages of the type schematically-outlined in FIG. 5. Here, chip 50 comprises an active surface area 51, including a plurality of bond pads 53; an array of solder balls 54 replaces the compliant spacer 44 layer in FIG. 4 and also performs the function of the leads 46 in FIG. 4. The array of solder balls 54 may be distributed uniformly over the whole active surface area 51. Interposer 55a has a plurality of solder balls 56 attached for connecting the device to an outside board. After the molding method of the invention, molded material 57 is added filling spaces around the periphery of chip 50 and spaces between solder balls 54. The encapsulation material 57 is forming surfaces 58a coplanar with the passive chip surface 52 as a flat extension of it, and also surfaces 58b coplanar to interposer 55a as a flat extension of its surface opposite to the IC. These surfaces, newly formed by the molding process of the invention, exhibit high luster, intensive color, and are free of cosmetic defects.

Using sawing as the preferred singulation method, peripheral surfaces 58c are generated. As in the example of FIG. 4, the device of FIG. 5 incorporates a frame 55b of interposer material in order to define the edge of the package. The singulated device of FIG. 5 will thus comprise precise package outlines and dimensions.

The device shown in FIG. 5 is a thin chip-scale package. After attachment of the solder balls, the overall profile is between 0.4 and 1.7 mm. Using the advantages of the encapsulation method of the present invention, a typical device profile is 0.7 mm.

Figure 6:
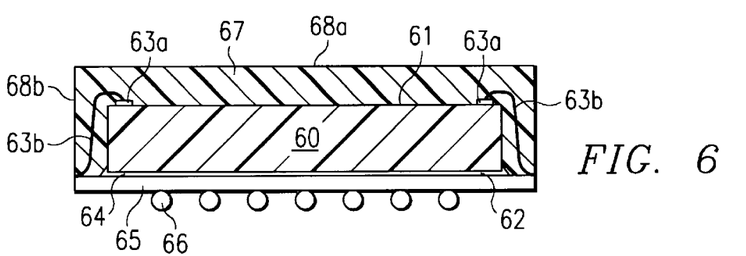
FIG. 6 and 7 are simplified schematic cross sections of semiconductor chips assembled on interposers and encapsulated according to yet another embodiment of the present invention.
Figure 7:
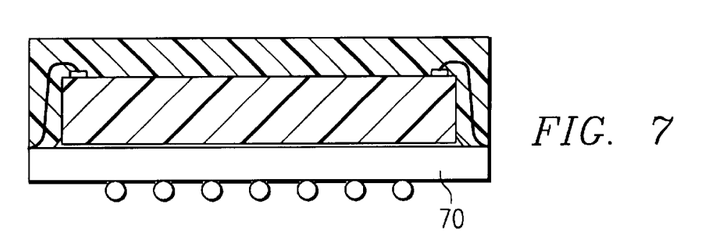

Using the embodiment of the invention depicted in FIG. 2, devices as shown in FIGS. 6 and 7 can be manufactured. IC chip 60 has an outline given by the sawing of the semiconductor material, an active surface 61 and a passive surface 62. The active surface 61 comprises the integrated circuit, including contact pads 63a around the periphery of the IC. The passive.surface 62 is glued by tacky film 64 to one surface of an electrically insulating interposer 65. In FIG. 6, this interposer is a sheet-like dielectric material, such as flexible polyimide (thickness about 0.1 to 0.2 mm). In FIG. 7, the interposer is made of a board-like dielectric material 70, such as FR-4 (thickness about 0.2 to 0.4 mm). The surface of the interposer onto which the chip is glued, also comprises around its perimeter a plurality of electrical entry ports. Electrically conductive paths extend through the interposer from the entry ports on one surface to the opposite surface, where they form exit ports. Whisker wires 63b connect the IC-Gontact pads 63a to the interposer entry ports; an array of solder balls 66 is attached to the interposer exit ports.

Whisker wires 63b are commonly gold, gold-beryllium alloy, or copper, between 15 to 32 $\mu$m thick (typically 20 $\mu$m). They form balls (typically 30 to 50 $\mu$m diameter) attached to the circuit contact pads 63a, and stitch bonds to the interposer entry ports. Known technology allows a pitch of gold balls between 70 and 100 $\mu$m. Moving the bonder capillary containing the gold wire on a predetermined and computer-controlled manner through the air will create a wire looping of exactly defined shape; for instance, recent technical advances allow the formation of rounded, trapezoidal, linear or looped paths of different looping heights. With this capability, wire loops at a safe distance from the edge of the chip yet close to its surface can be manufactured, thus creating devices with thin profile.

The low viscosity materials employed by the present invention allow an encapsulation of the device without disturbing the whisker wires (so-called "wire sweep") looped close to the chip surface. Furthermore, the molded material 67 can be kept thin, yet with a perfectly flat, high-luster surface 68a. After curing of the encapsulation material and removing the encapsulated devices including interposer 65, or 70 respectively, from the mold, an array of solder balls 66 is attached to the exit ports on the exposed surface of the interposer. Finally, the encapsulated devices are sinculated, commonly by sawing. The sawing operation creates straight, sharp-cornered edges 68b. The device outline thus formed is substantially the same as the outline of the chips, producing chip-scale packages with thin profile.

Figure 8:
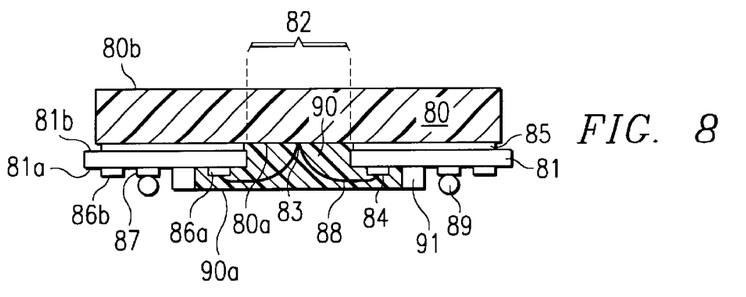
FIG. 8 is a simplified schematic cross section of an integrated circuit chip assembled on an interposer with an opening and encapsulated according to another embodiment of the present invention.

FIG. 8 is a simplified schematic cross section of an integrated circuit chip 80 assembled on an interposer 81 with an opening 82 in its center, which is needed for so-called center-line bonding. ICs of this structure are especially common in dynamic random-access memories (DRAMs), synchronous DRAMS (SDRAMs), static random-access memories (SRAMs), erasable programmable read-only memories (EPROMs), but also in logic circuits (LOGIC), microprocessor, digital signal processor, and many other IC components. In center-line bonding, the balls 83 of the bonding wires are aligned approximately along the center-line of the chip, while the stitches 84 are affixed to pads on the interposer.

An electrically insulating interposer, or board, 81 with a first surface 81a and a second surface 81b has its second surface 81b attached to the active surface 80a of chip 80 by means of an adhesive layer 85. Chip 80 has typically a thickness between 0.2 to 0.5 mm, preferably 0.28 mm. The passive surface 80b of chip 80 is facing the environment and is thus available for dissipating thermal energy and cooling of the heat generated by the chip in operation. The interposer 81 has a plurality of electrically conductive routing strips 86a and 86b and a plurality of contact pads 87 deposited on its first surface 81a. Routing strips 86a and 86b and contact pads 87 comprise copper layers, or copper with gold-flash surface, or refractory metal layers followed by copper layers with gold flash. Alternatively, they may comprise copper layers followed by nickel layers.

Interposer 81 is made of electrically insulating material such as FR-4, which is an epoxy resin, or a cyanate ester resin, reinforced with a woven glass cloth. Alternatively, a polyimide-based interposer may be used. Interposer 81 has a thickness between 0.1 and 0.7 mm; a preferred thickness is 0.2 mm. It is designed to have substantially the same outline as IC chip 80. The adhesive layer 85 may be made of, for example, a doublesided adhesive polyimide tape, adhesive glue, epoxy, or thermoplastic adhesive.

As shown in FIG. 8, one group of contact pads 86a is positioned immediately close to (and approximately parallel to) the edges if opening 82. These contact pads 86a receive the stitch ends 84 of whisker wires 88; the surface of pads 86a are compatible with easy stitch bonding and comprise a gold flash surface. Lateral dimensions of stitch imprints are about three times the wire diameter; the exact shape of the stitches depend on the shape of the capillary used, such as capillary wall thickness and capillary footprint. Wires 88 connect to the chip bonding pads (and form gold balls 83). Attached to contact pads 87 are solder balls 89 which are needed for the final package attachment to the customer application boards. The surface of contact pads 87 comprises gold, palladium, or platinum for easy attachment of solder balls.

Is it advantageous for achieving minimum device profile to position the bus bars 86b (supplying power and ground potential) parallel to and in immediate proximity to the edges of chip 80. With the bus bars positioned far away from any wire crossing, any electrical insulation against wire shorting is no issue, and bonding wires 88 may be affixed with minimum looping by moving the bonding capillary the shortest feasible distance over the surface of interposer 81. As a consequence, the looping of wires 88 can cross the interposer 81 at a height of approximately 10 $\mu$m and approach the pad surface at a low angle (at the stitch, there is no minimum height for a ball needed, nor is there a feat-affected zone like near the-ball which would be mechanically w eak for bending or other deformation stresses).

After wire bonding, the opening 82 is filled according to the teachings of the present invention with encapsulation material 90 up to a height of about 20 to 50 $\mu$m on top of surface 81a, forming surface 90a. The encapsulation material will be contained by polymer stopping walls 91 which are 20 to 50 $\mu$m high and have been pre-attached to interposer 81. The thickness, or profile, of the filled opening is between 0.15 and 0.3 mm; the preferred profile of the filled opening is 0.2 mm. The surface 90a of the encapsulation material is coplanar with stopping walls 91, completely flat, and exhibits a high luster.

The diameter, or thickness of the solder balls 89 must exceed the thickness of the molding material 90 extending over surface 81a. Since the minimum wire looping permits thin molding material thickness, the solder balls need only the relatively small diameter of typically 0.1 to 0.3 mm; preferred solder ball diameter is 0.2 mm. Consequently, the thickness, or profile, of the overall chip-scale package is 0.3 to 1.2 mm; the preferred profile is about 0.5 mm.

Figure 9:
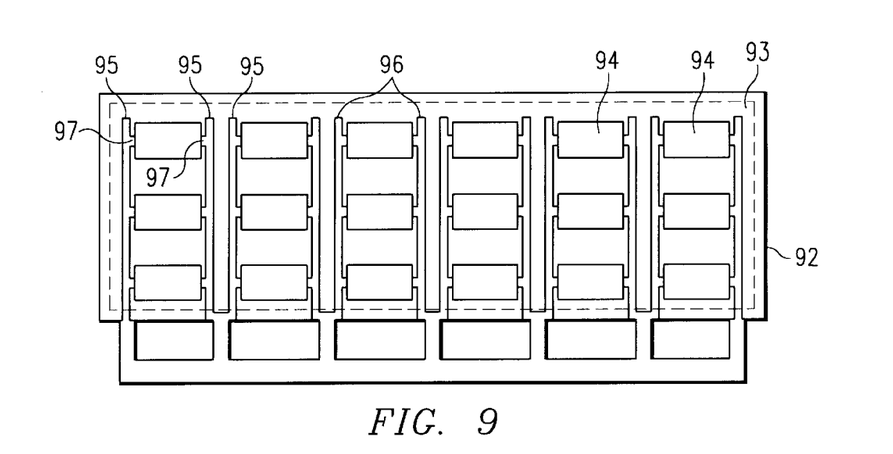
FIG. 9 is a simplified top view of rnnners and the cavity of a mold loaded with an interposer and a plurality of pre-assembled integrated circuit chips, the runners being arranged in pairs comprising a plurality of dual gates according to the invention.

In variation to FIG. 3, FIG. 9 shows another embodiment of the invention for fabricating ultra-thin packages, namely the preferred runner design for so-called "dual gating" in a mold used for encapsulating device types which exhibit openings like the example shown in FIG. 8. For optimizing the dimensional design of the runners, computerized process flow modeling is employed based on the encapsulation material selected. Depicted in FIG. 9 is one mold half 92 (may be bottom or top) with its cavity for holding the electrically insulating interposer 93 with a plurality of pre-assembled IC chips 94. According to the 3-P technology, thin plastic films cover the inner walls of the mold cavity. A plurality of runners 95 for feeding encapsulation material to the cavities is laid out so that the runners form pairs 96 of runners parallel to each other. The runners comprise gates 97 opposite to each other, forming dual gates. These gates open to the devices to be filled, for instance to both ends of the center opening of devices described in FIG. 8. Each pair of runners is configured so that the encapsulation material pressed through the runners will exit from adjacent gates concurrently. Further, each pair of dual gates is structured such that they fill the cavity between them uniformly with encapsulation material, thus enabling to fill the narrow openings of thin devices without disturbing sensitive whisker wires.

Figure 10:
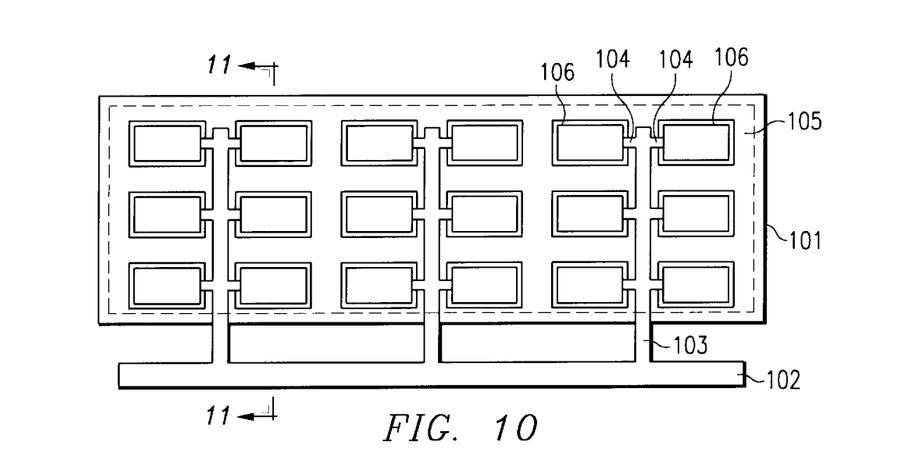
FIG. 10 is a simplified top view of runners and the cavity of a mold loaded with an interposer and a plurality of pre-assembled integrated circuit chips, the gates feeding through slots in the interposer to spaces forming a frame around each chip, to be filled with encapsulation material according to the invention.

Another embodiment of the present invention is illustrated in FIGS. 10 and 11, which are a variation of the high throughput mold depicted in FIG. 9, for an alternative way to encapsulate devices as shown in FIG. 1. In the schematic top view, the cavity 101 is depicted together with groove 102, runners 103 and gates 104. The shape and dimensions of the runners and gates are determined by computerized mold flow modeling for synchronized and equalized filling of the cavities. The molding compound in its pre-packaged, pencil-shaped wrapping is positioned in groove 102. The molding compound is pressured through runners 103 to the plurality of gates 104, which open into slots of the interposer 105 so that a molded frame 106 around each device can be fabricated. In FIG. 1, the location of the interposer slots is indicated by designation 45b (marking the newly molded surfaces), and the molded frame by designation 48.

The mold half depicted in FIG. 10 is preferably the bottom half of the mold, because it is easy load it with interposer 105 and the pre-assembled chips. Then the top half has to be designed with castellations as indicated in FIG. 11. The schematic cross section of the mold is generally designated as 300. The wrapped molding material 111 is located in groove 112. The top mold half 113 (made of steel, ceramic or other high temperature tolerant material) exhibits castellations 114, separating the individual devices to be encapsulated. The inner surfaces of the top mold half 113 are completely lined with thin plastic film 115 (similar to the bottom mold half) according to the 3-P technology.

In FIG. 11, the devices are indicated by silicon chips 116 attached to spacer layers 117, glued onto interposer 118. This interposer 118 exhibits slots 119 through which the molding compound is pressured from the bottom up. The molding compound will then form a molded frame around the device including the flat surface coplanar with the passive surface of the chip, as described in conjunction with FIG. 4 (designating numbers 48, 49a, 49b, and 49c).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a semiconductor chip having an outline and active and passive surfaces, said active surface having an integrated circuit including a plurality of contact pads;
   an electrically insulating interposer having an outline substantially the same as said outline of said chip, an opening, first and second surfaces, a plurality of electrically conductive strips integral with said first surface, a plurality of metal pads disposed on said first surface, and said second surface adhered to said active surface of said chip;

bonding wires electrically connecting said circuit contact pads with said conductive strips; and encapsulation material filling said opening to cover said electrical connections and contact pads.

2. The semiconductor device according to claim 1 wherein said semiconductor chip comprises silicon, silicon germanium, gallium arsenide and any other semiconductor material used in electronic device production.

3. The semiconductor device according to claim 1 wherein said interposer is a board-like dielectric substrate.

4. The semiconductor device according to claim 1 wherein a plurality of solder balls is disposed on said metal pads.

5. The semiconductor device according to claim 4 wherein the overall profile of said device is between about 0.3 and 1.2 mm.

6. The semiconductor device according to claim 4 wherein the overall profile of said device is about 0.5 mm.

7. The semiconductor device according to claim 1 wherein the profile of said filled opening is between 0.15 and 0.3 mm.

8. The semiconductor device according to claim 1 wherein the profile of said filled opening is about 0.2 mm.

9. The device of claim 1, wherein said opening is in a center portion of said interposer outline.

10. The device of claim 1, wherein said opening is at a peripheral portion of said interposer outline.

11. The device of claim 1, wherein said interposer is a flexible dielectric substrate.

12. A method of encapsulating a semiconductor device comprising the steps of:

providing a mold having top and bottom halves each with cavities for holding semiconductor devices, and further having gates and runners for feeding encapsulation material into said cavities;

lining said cavities with protective plastic film;

providing a plurality of semiconductor integrated circuit chips, each having an outline, active and passive surfaces, and a plurality of contact pads disposed on said active surface of said chip;

providing an electrically insulating interposer, having first and second surfaces, a plurality of openings, and further a plurality of electrical coupling members;

attaching said active surface of said chips to said second surface of said interposer such that said contact pads of each said chips remain exposed in one of said openings, respectively;

electrically connecting each of said coupling members to one of said chip contact pads, respectively, thereby pre-assembling said chips onto said interposer;

positioning said interposer pre-assembled with said chips into said bottom mold half, thereby resting said passive chip surfaces on said film and positioning said active chip surfaces away from said bottom mold half;

closing said mold by clamping said top half onto said bottom half whereby said films form a tight seal surrounding said interposer and further form a tight alignment of said film lining said top mold half with said active surface of said chips;

pressuring low-viscosity, high adhesion encapsulation material through said runners and gates into said cavities, thereby depositing flowable encapsulation material throughout said interposer openings of said pre-assembled chips;

at least partially curing said encapsulation material, thereby forming a flat and high-luster surface;

opening said mold and removing said interposer together with said encapsulated chips from said mold;

attaching an array of solder balls to the exposed surface of said interposer; and singulating said encapsulated semiconductor devices, thereby forming devices having an outline substantially the same as said outline of said chips.

13. The method of claim 12, wherein said step of providing a mold having top and bottom halves each with cavities for holding semiconductor devices, and further having gates and runners for feeding encapsulation material into said cavities, comprises providing a mold having a plurality of runners comprising pairs of runners parallel to each other and having gates opposite to each other.

14. An apparatus for the fabrication of a semiconductor device comprising:

a mold having top and bottom halves each with cavities for holding semiconductor chips pre-assembled on an electrically insulating interposer;

one of said halves having a plurality of runners and a plurality of gates for feeding encapsulation material into said cavities;

said plurality of runners comprising pairs of runners parallel to each other, having gates opposite to each other, thereby forming dual gates;

each pair of runners being configured such that said encapsulation material will exit from adjacent gates concurrently; and each pair of dual gates being structured such that they fill the cavity between them uniformly with encapsulation material, thereby encapsulating thin semiconductor devices.

15. The apparatus according to claim 14 wherein said runners and gates are designed to encapsulate devices having molded profiles between 0.15 and 0.3 mm.

16. The apparatus of claim 14, further comprising protective plastic film lining said mold cavities.

* * * * *